(12) United States Patent
Menard et al.

(10) Patent No.: US 9,343,557 B2
(45) Date of Patent: *May 17, 2016

(54) VERTICAL POWER COMPONENT

(71) Applicants: STMicroelectronics (Tours) SAS, Tours (FR); Universite Francois Rabelais, Tours (FR)

(72) Inventors: Samuel Menard, Tours (FR); Gaël Gautier, Veretz (FR)

(73) Assignees: STMICROELECTRONICS (TOURS) SAS, Tours (FR); UNIVERSITE FRANCOIS RABELAIS, Tours (FR)

( * ) Notice: Subject to any disclaimer, the term of this patent is extended or adjusted under 35 U.S.C. 154(b) by 0 days.

This patent is subject to a terminal disclaimer.

(21) Appl. No.: 13/762,288

(22) Filed: Feb. 7, 2013

(65) Prior Publication Data

US 2014/0217462 A1    Aug. 7, 2014

(51) Int. Cl.
*H01L 29/66* (2006.01)
*H01L 29/74* (2006.01)
*H01L 29/747* (2006.01)
*H01L 29/06* (2006.01)

(52) U.S. Cl.
CPC ........ *H01L 29/7424* (2013.01); *H01L 29/0619* (2013.01); *H01L 29/66386* (2013.01); *H01L 29/747* (2013.01)

(58) Field of Classification Search
CPC .................. H01L 21/02203; H01L 21/31695; H01L 21/76259; H01L 21/0203; H01L 2924/0002; H01L 29/7424

USPC .................................. 257/119–200, 600–778
See application file for complete search history.

(56) References Cited

U.S. PATENT DOCUMENTS

| 5,767,561 | A * | 6/1998 | Frei et al. ...................... 257/499 |
| 8,994,065 | B2 * | 3/2015 | Menard et al. ................. 257/119 |
| 2004/0124439 | A1 * | 7/2004 | Minami et al. ................. 257/200 |
| 2011/0210372 | A1 * | 9/2011 | Menard et al. ................. 257/119 |
| 2013/0161757 | A1 * | 6/2013 | Huang ............ H01L 21/823878 257/369 |

OTHER PUBLICATIONS

Menard et al, "Non-oxidized porous silicon-based power AC switch peripheries" http://www.nanoscalereslett.com/content/7/1/566; Oct. 11, 2012; 7:566; 10 pgs.

* cited by examiner

*Primary Examiner* — Jerome Jackson, Jr.
*Assistant Examiner* — Fang-Xing Jiang
(74) *Attorney, Agent, or Firm* — Allen, Dyer, Doppelt, Milbrath & Gilchrist, P.A.

(57) ABSTRACT

A high-voltage vertical power component including a silicon substrate of a first conductivity type, and a first semiconductor layer of the second conductivity type extending into the silicon substrate from an upper surface of the silicon substrate, wherein the component periphery includes: a porous silicon ring extending into the silicon substrate from the upper surface to a depth deeper than the first layer; and a doped ring of the second conductivity type, extending from a lower surface of the silicon surface to the porous silicon ring.

16 Claims, 3 Drawing Sheets

VERTICAL POWER COMPONENT

BACKGROUND

1. Technical Field

The present disclosure relates to a vertical power component capable of withstanding a high voltage (greater than 500 V) and more specifically to the peripheral structure of such a component.

2. Discussion of the Related Art

FIGS. 1, 2, 3, and 4 are cross-section views showing various ways of forming the periphery of such a high-voltage vertical power component to enable it to withstand high voltages.

These drawings show a triac comprising a lightly-doped N-type silicon substrate 1 (N$^-$), currently with a doping ranging from $10^{14}$ to $10^{15}$ atoms/cm$^3$, having its upper and lower surfaces comprising P-type doped layers or regions 3 and 5. Upper layer 3 contains a heavily-doped N-type region 4 and lower layer 5 contains a heavily-doped N-type region 6 in an area substantially complementary to that taken up by region 4. An electrode A1 coats the lower surface of the component and is in contact with regions 5 and 6. An electrode A2 coats the upper surface of the component and is in contact with region 4 and a portion of region 3. In region 3 is also formed a heavily-doped N-type region 8 of small extension, and a gate electrode G covers region 8 and a portion of region 3. Thus, whatever the biasing between electrodes A1 and A2, if a gate control is provided, the component turns on. The conduction is performed from electrode A1 to electrode A2 through a vertical thyristor comprising regions 5, 1, 3, and 4, or from electrode A2 to electrode A1 through a vertical thyristor comprising regions 3, 1, 5, and 6. The thickness and the doping level of substrate 1 are calculated so that the triac, in the off state, can withstand high voltages, for example, voltages ranging between 600 and 800 volts. It should then be avoided that breakdowns occur at the component edges.

FIG. 1 shows a so-called double-mesa peripheral structure for avoiding such Breakdowns. A ring-shaped lateral trench deeper than P regions 3 and 5 is formed at the periphery of each of the two surfaces of the substrate. These trenches are filled with a passivation glass 9. In practice, trenches are initially formed on a silicon trench between two components before dicing of the chip into individual components. If a breakdown occurs, it occurs in areas 11 where the PN$^-$ junctions cut insulating trenches 9.

A disadvantage of double-mesa structures is that, given that the passivation glass never has the same thermal expansion coefficient as silicon, the interface between glass and silicon ages poorly and, in case of an incidental breakdown, if the voltage across the component exceeds the authorized limit, the component is no longer operative.

Another disadvantage of double-mesa is due to the fact that the lateral surfaces of substrate 1 are not insulated. Thus, when the component electrodes are welded to contact areas of another electronic device or of a package, it should be provided that lateral wickings do not electrically connect one of the electrodes to substrate 1, which would short-circuit the corresponding PN$^-$ junction.

FIG. 2 shows another conventional peripheral structure of the power component. A groove filled with a passivation glass is present on the upper surface side. The component is surrounded with a heavily-doped P-type diffused wall 12 formed from the upper and lower surfaces and the groove extends between wall 12 and P-type layer 3, substantially as shown. Thus, all voltage hold areas are gathered on the upper surface side of the component. Breakdowns are likely to occur at the periphery of the junction between wall 12 and substrate 1, on the groove side, in the area designated with reference numeral 14, when lower electrode A1 is negative with respect to upper electrode A2 (so-called reverse breakdown); and breakdowns are likely to occur at the periphery of the junction between substrate 1 and layer 3, on the groove side, in the area designated with reference numeral 16, when lower electrode A1 is positive with respect to upper electrode A2 (so-called forward breakdown).

This structure provides good results, and simplifies the forming of lower electrode A1 and the steps of welding to an external device. In particular, the presence of wall 12 thus prevents any risk of short-circuit due to possible lateral wickings.

However, a disadvantage is that distance e2 between the component edge and the glassivation limit (beginning of electrode A2 or G, respectively) is greater than distance e1 between the component edge and the glassivation limit in the former case. As an example, in the best conditions, that is, when the angle according to which the trenches filled with glass cut the junctions between the substrate and layers 3 and 5 is properly chosen, and when the amount of glass is optimized, in order to obtain a breakdown voltage greater than 800 volts, a distance e1 on the order of 300 µm should be provided in the case of FIG. 1, and a distance e2 on the order of 350 µm should be provided in the case of FIG. 2. This decreases, by this distance, the surface area available for the electrodes of the power component of FIG. 2; otherwise, for given values of the electrode surface areas, this increases the surface area of the component, and thus its cost.

Further, as in the previous case, the interface between the silicon and the passivation glass remains a problem.

Further, the presence of grooves only extending on the front surface side of the semiconductor substrate may raise mechanical stress issues.

Further, region 3 being relatively close to diffused wall 12, there is a risk of breakdown of the component by punch-through of the bipolar transistors formed by P-type region 3, N-type substrate 1, and P-type wall 12, which limits the voltage behavior of the component.

FIG. 3 shows a passivation structure in so-called "planar" technology. As in the case of FIG. 2, the structure is surrounded with a heavily-doped P-type ring-shaped wall at its periphery. To withstand the voltage, a distance is provided between the limit of P-type layer 3 and peripheral wall 20. A breakdown, if any, would occur in regions 23 of curvature of P well 3 or in region 24 of junction between P layer 5 and substrate 1.

An advantage of this structure is that a breakdown is not necessarily destructive for the component. However, this structure has the disadvantage of requiring a channel stop ring 22 at the periphery of the upper surface in the region of N substrate 1 between the limit of P region 3 and the limit of insulating wall 20. This entails the disadvantage of requiring a relatively large guard distance e3 between the component edge and the limit of electrode A2, for example, on the order of 370 µm to withstand a voltage greater than 800 volts.

Further, the method for forming this structure requires a larger number of masks than for previous structures.

FIG. 4 shows another peripheral structure for avoiding breakdowns, which is described in patent application US 2011/0210372. At the component periphery, on the lower surface side, is a heavily-doped P-type diffused wall region 30 crossing P-type layer 5 and penetrating down to a depth into substrate 1 of substantially half the substrate thickness. On the upper surface side, at the component periphery, a deep straight groove 32 joins diffused region 30. Groove 32 is insulated at its periphery by an oxide layer 33 and is filled with undoped silicon 34 in its central portion. To withstand a high voltage, a distance e4 is provided between the limit of P-type layer 3 and the groove 32. In such a structure, forward breakdowns may occur in bending region 36 of P-type layer 3 and reverse breakdowns may occur in region 38 at any point along the lower junction formed by layer 5 and substrate 1. In order to control the extension of the space charge area (especially for the reliability of the forward junction) and avoid any surface inversion phenomenon, a more heavily-doped N area 40 need to be provided in the vicinity of the end of the groove on the upper surface side.

A disadvantage of the structure of FIG. 4 is that, as in the case of FIG. 3, the P-type region 3 is localized in the central portion of the component. Thus, forming the component requires a larger number of masks than for the structures of FIGS. 1 and 2.

SUMMARY

An embodiment provides a peripheral power component structure overcoming at least some of the disadvantages of known peripheral structures.

Thus, an embodiment provides a high-voltage vertical power component comprising a silicon substrate of a first conductivity type, and a first semiconductor layer of the second conductivity type extending into the silicon substrate from an upper surface of the silicon substrate, wherein the component periphery comprises: a porous silicon ring extending into the silicon substrate from said upper surface to a depth deeper than said first layer; and a doped ring of the second conductivity type, extending from a lower surface of the silicon surface to said porous silicon ring.

According to an embodiment, said first layer extends laterally to the porous silicon ring.

According to an embodiment, said porous silicon ring has a porosity ranging between 30 and 70 percent.

According to an embodiment, said porous silicon ring is partially oxidized.

According to an embodiment, said porous silicon ring extends in depth by between one third to two thirds of the thickness of the silicon substrate.

According to an embodiment, the above-mentioned component forms a triac, wherein:

a first region of the first conductivity type extends in a portion of said first layer, said first region and a portion of said first layer being in contact with a first electrode; a second semiconductor layer of the second conductivity type extends into the silicon substrate from the lower surface of the silicon substrate; and a second region of the first conductivity type, extends in a portion of said second layer, substantially complementary to the first region in projection.

Another embodiment provides a method for forming the high-voltage vertical power component of claim 1, comprising the successive steps of: forming a heavily-doped vertical ring-shaped wall, extending from the upper surface to the lower surface of the silicon substrate; making an upper portion of said wall porous; and forming diffused regions of the component.

According to an embodiment, the substrate is of type N, and said wall is formed by diffusion of boron atoms from the lower and upper surfaces of the substrate.

According to an embodiment, the substrate is of type N, and said wall is formed by temperature gradient zone melting.

According to an embodiment, the substrate is of type P, and said wall is formed by diffusion of phosphorus atoms from the lower and upper surfaces of the substrate.

The foregoing and other features and advantages will be discussed in detail in the following non-limiting description of specific embodiments in connection with the accompanying drawings.

DETAILED DESCRIPTION

Figure 1:
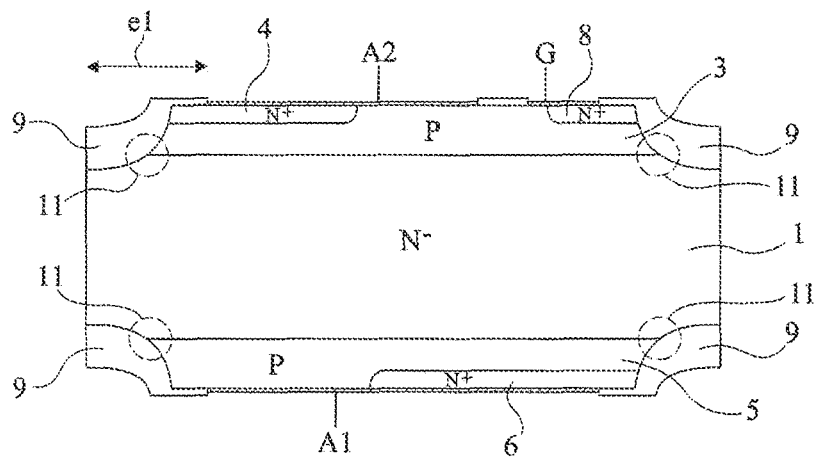
FIGS. 1 to 4, previously described, are cross-section views showing various known vertical power component structures.

For clarity, the same elements have been designated with the same reference numerals in the different drawings and, further, as usual in the representation of integrated circuits, the various drawings are not to scale.

Figure 4:
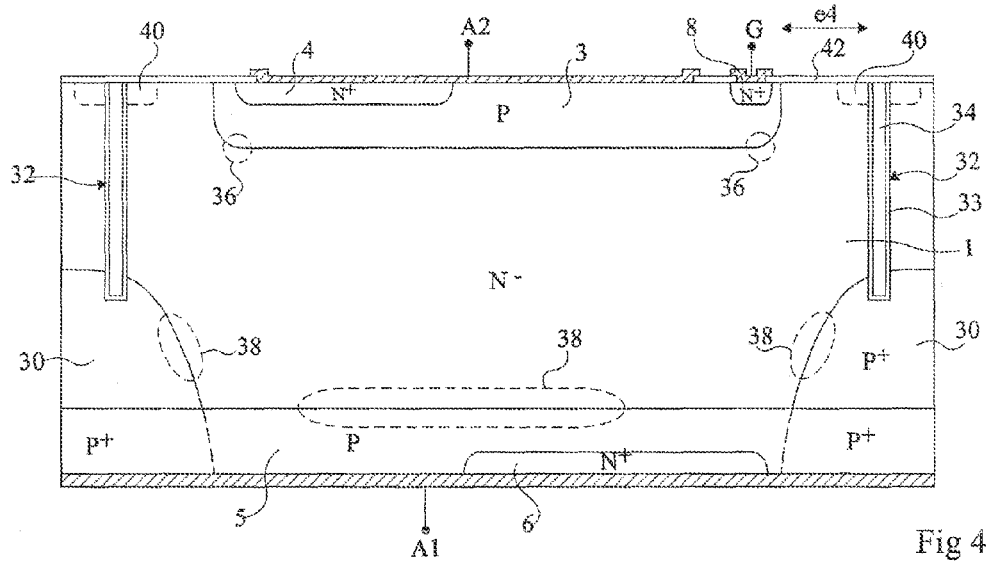
Figure 5:
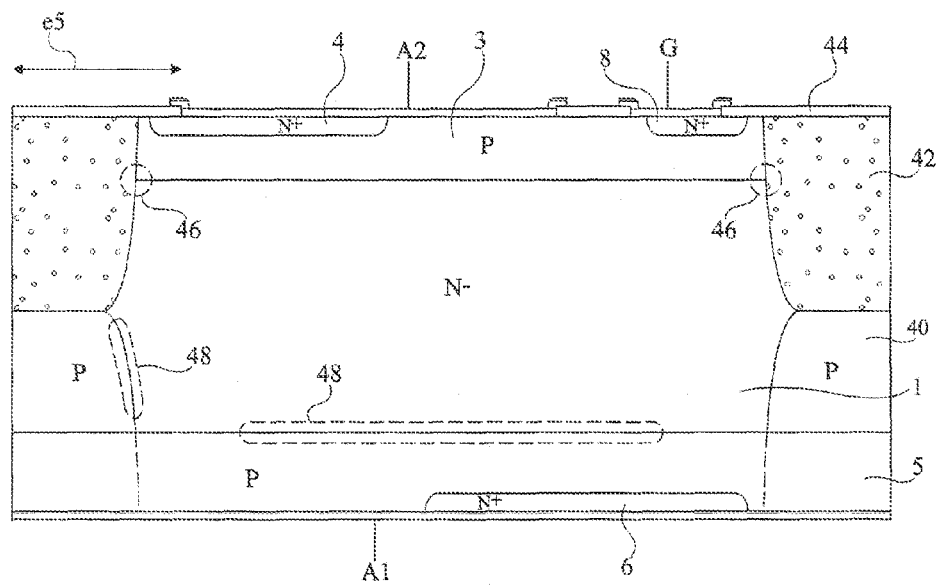
FIG. 5 is a cross-section view showing an embodiment of a vertical power component structure.

FIG. 5 shows a triac having its different elements designated with the same reference numerals as the corresponding elements of FIGS. 1, 2, 3, and 4.

At the component periphery, one can find, on the lower surface side, a heavily-doped P-type portion of diffused wall 40, crossing lower P-type layer 5 and penetrating down to a certain depth into substrate 1 (substantially across half the substrate thickness in the shown example). One can further find on the upper surface side, substantially in front of diffused wall portion 40, a deep ring-shaped region 42, made of porous silicon, joining diffused region 40.

On the upper surface side, P-type doped layer 3 extends all the way to porous silicon ring-shaped region 42. In the shown example, heavily-doped N-type regions 4 and 8 extend all the way to the neighborhood of ring-shaped region 42. A small guard distance, for example, approximately ranging from 1 to 10 micrometers, may be provided between the inner edge of ring-shaped region 42 and regions 4 and 8.

Electrodes A1, A2, and G are for example made of aluminum. An upper insulating passivation layer 44, for example made of silicon oxide or of glass, coats the upper surface of ring-shaped region 42, as well as all the component surfaces which are not taken up by a metallization (except for the lateral surfaces). On the upper surface side, a distance e5 separates the component edge from the limit of passivation layer 44 (beginning of electrode A2 or G, respectively).

One will note that porous silicon has an electrical behavior of semi-resistive type. The electrical behavior of porous silicon has been described in more detail in the article "Non-oxidized porous silicon-based power AC switch peripheries", that describes a study made by the inventors on the use of porous silicon in high-voltage component peripheries. The porous silicon of the ring-shaped region 42 is chosen to be sufficiently resistive to withstand high voltage (for example greater than 500 V) at the termination of the PN junctions between layer 3 and substrate 1 and between layer 5 and region 40 and substrate 1. However, the porous silicon of the ring-shaped region 42 still has semi-conductive properties, allowing an accumulation of mobile charges at the interface between the ring 42 and the substrate to be avoided, and thus increasing the reliability and the voltage hold performances of the component. This constitutes a difference in comparison with the structure of FIG. 4, in which the peripheral groove 32 is insulated by an oxide layer 33. In the structure of FIG. 4, mobile charges are susceptible to accumulate at the interface between the substrate and the oxide layer 33, which may decrease the reliability and the voltage hold performances of the component. For this reason, in the structure of FIG. 4, a non-zero distance e4 is provided between the limit of P-type layer 3 and the groove 32. An advantage of the structure of FIG. 5 is that the P-type layer 3 may extend laterally up to the ring-shaped region 42 of porous silicon, which reduces the number of masks necessary to realize the component, and the cost of the component.

In the structure of FIG. 5, forward breakdowns may occur in region 46 where the upper PN⁻ junction formed by layer 3 and substrate 1 cuts ring-shaped region 42 of porous silicon, and reverse breakdowns may occur in region 48 almost all along the P⁻ junction between substrate 1 and layer 5 or wall portion 40.

An advantage of such a structure is that width e5 of the peripheral ring of the component is relatively small. In particular, distance e5 is shorter than the corresponding distances e2 and e3 in the structures of FIGS. 2 and 3. As an example, distance e5 is of the same order as distance e1 in the case of FIG. 1, that is, on the order of 300 µm to obtain a breakdown voltage greater than 800 volts.

Further, an advantage of the provided structure over the structure of FIG. 1 is the ease of manufacturing of lower electrode A1 and of assembly of the component.

Another advantage is that the porous silicon region 42 keeps the crystal structure of silicon, and thus has a thermal expansion coefficient close to that of non-porous silicon. An advantage is that no problem of premature aging at the interface between regions 1 and 3 and region 42 is posed. Further, in case of an incidental breakdown caused by a very high overvoltage, the component is not necessarily destroyed.

Figure 2:
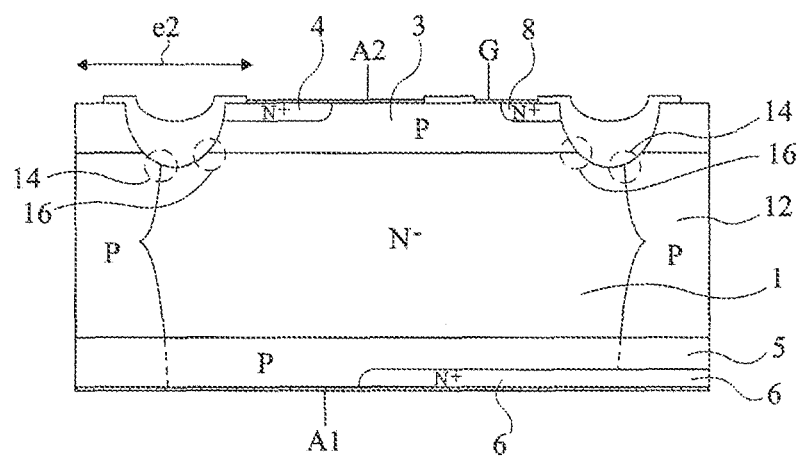
Figure 3:
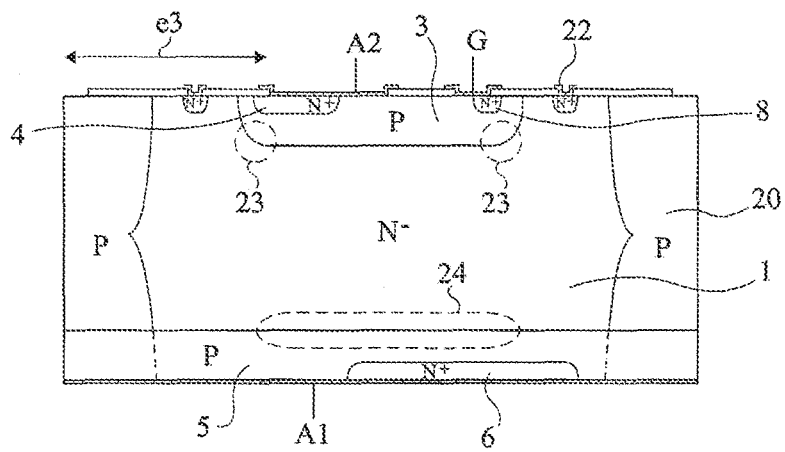

Another advantage of such a structure is that it has an increased mechanical resistance with respect to a groove structure of the type described in relation with FIG. 2.

Further, in the provided structure, region 3 is relatively distant from diffused wall portion 40. The risk of component breakdown by punchthrough effect is thus considerably decreased with respect to a structure of the type described in relation with FIG. 2.

Another advantage is that the number of masks necessary to form such a structure is not higher than the number of masks necessary to form the structure of FIG. 2.

Figure 6A:
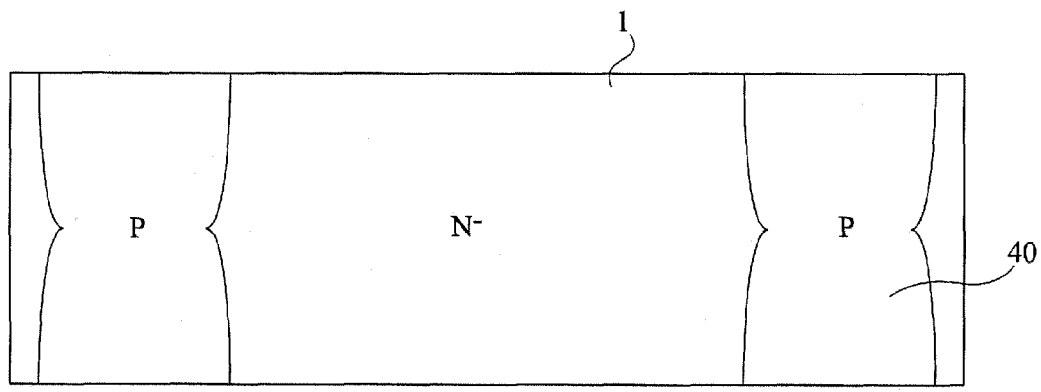
FIGS. 6A to 6C are cross-section views showing steps of an example of a method for manufacturing the structure of FIG. 5.
Figure 6B:
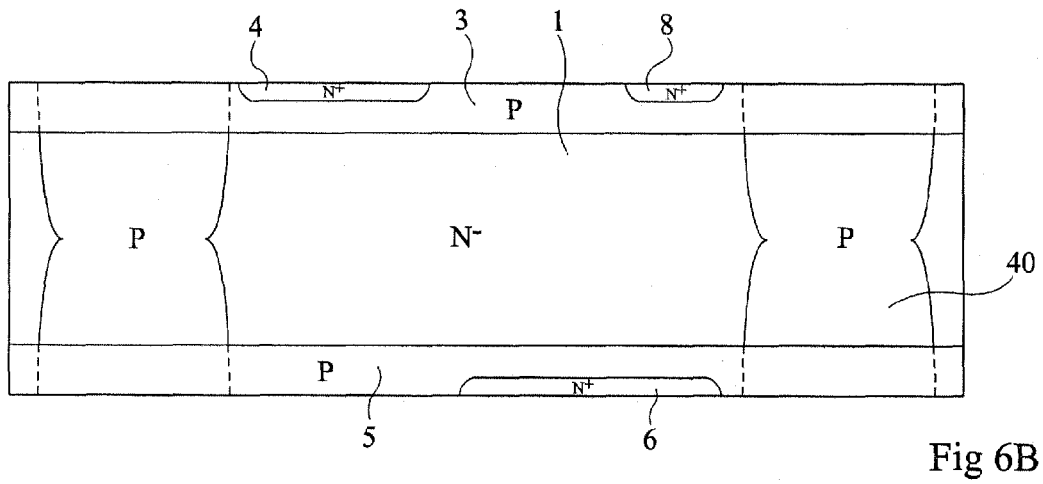
Figure 6C:
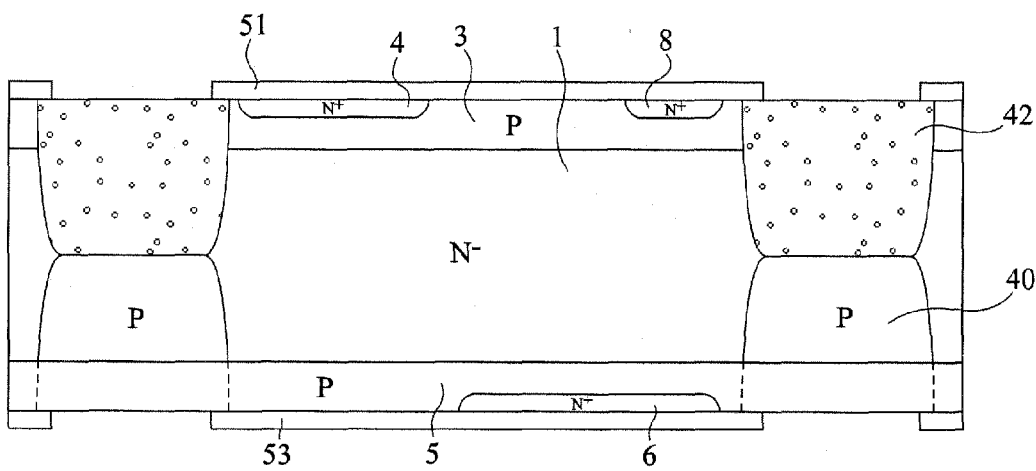

FIGS. 6A to 6C are cross-section views illustrating steps of a method for manufacturing the structure of FIG. 5.

FIG. 6A shows a portion of a lightly-doped N-type semiconductor trench 1. FIG. 6A more specifically illustrates the forming of a heavily-doped P-type vertical ring-shaped diffused wall 40, from the upper and lower surfaces of substrate 1. Wall 40 delimits a substrate portion in which the power component will be formed. In practice, the diffused walls are formed on the silicon trench between two components before dicing of the chip into individual components. When, later on, the trench is diced into individual components, the dicing lines follow, in top view, longitudinal axes substantially crossing the middle of the diffused walls.

As an example, substrate 1 has a thickness ranging between 200 and 300 µm, for example, being on the order of 250 µm, and wall 40 is formed by diffusion of boron atoms or other P-type doping elements such as aluminum or gallium atoms, with a surface concentration approximately ranging from $5*10^{17}$ to $5*10^{18}$ atoms/cm³, for example, being on the order of $10^{18}$ atoms/cm³. The diffusion depth is selected to be greater than or equal to half the substrate thickness, so that the upper and lower diffused regions join in the middle of the substrate thickness to form wall 40.

FIG. 6B illustrates a step of forming of layers 3 and 5 and of regions 4, 6, and 8 of the component. As an example, layers 3 and 5 are formed by diffusion of boron atoms down to a depth approximately ranging from 20 to 50 µm, for example, on the order of 35 µm, with a surface concentration approximately ranging from $10^{18}$ to $10^{19}$ atoms/cm³, for example, on the order of $5*10^{18}$ atoms/cm³. Regions 4, 6, and 8 may be formed by diffusion of phosphorus atoms down to a depth approximately ranging from 5 to 15 µm, for example, on the order of 10 µm, with a surface concentration approximately ranging from $5*10^{19}$ to $3*10^{20}$ atoms/cm³, for example, on the order of $10^{20}$ atoms/cm³.

FIG. 6C illustrates a step of forming of ring-shaped region 42, made of porous silicon, in front of the lower portion of wall 40. Region 42 actually corresponds to an upper portion of wall 40 of FIG. 6B, which is made porous, for example, by an electrochemical dissolution method.

In this example, an upper insulating protection layer 51 is formed on the upper surface of the semiconductor trench, and has openings in front of the upper surface of wall 40. A lower insulating protection layer 53 may optionally be formed on the lower surface of the trench, and has openings in front of the lower surface of wall 40. Layers 51 and 53 are, for example, made of silicon nitride ($Si_3N_4$).

The trench is then plunged into an electrolytic solution based on hydrofluoric acid, between two respectively positive and negative electrodes, so that a current flows between the two electrodes, through the electrolytic solution and through wall 40. In this example, the negative electrode is arranged on the upper surface side of the trench, and the positive electrode is arranged on the lower surface side of the trench. On the negative electrode side (upper surface), a reaction resulting in progressively transforming the heavily-doped P-type silicon into porous silicon wall 40 occurs. This reaction essentially occurs in front of the openings formed in protection layer 51 and in the heavily-doped P-type portion corresponding to the upper portion of the wall.

The duration of the electrochemical etching and the intensity of the current flowing between the electrodes determine the degree of porosity (pore percentage) and the depth of ring-shaped region 42. In the shown example, ring-shaped region 42 approximately extends across half the substrate thickness. More generally, it may be provided for region 42 to extend down to a thickness ranging between approximately one third and approximately two thirds of the substrate thickness. The electrical properties of region 42 depend on the degree of porosity of silicon, which may be selected by adjusting the electrolysis parameters. The desired voltage hold performance can thus be obtained. As an example, a region 42 having a degree of porosity approximately ranging from 30 to 70% may be formed. To achieve this, a solution based on hydrofluoric acid and ethanol may be used, through which an electrolysis current approximately ranging from 10 to 80 mA/cm² for a duration approximately ranging from 15 to 60 minutes is made to flow. It is further possible to adjust the current densities during the electrolysis, to form a region 42 having a degree of porosity varying according to depth. Further, after the electrochemical etching, a step of partial oxidation of the porous silicon 42 may be provided, which enables its resistivity to be increased. However, the porous silicon region 42 should not be entirely oxidized, so that the region 42 preserves semi-conductive properties that differentiates it from silicon oxide, and allows evacuation of mobile charges at the interface between region 42 and the silicon substrate.

Subsequent steps of removal of protection layers 51 and 53 and of forming of the electrodes and of the passivation layer are then provided.

It should be noted that it is preferable to provide forming porous silicon region 42 after the forming of the various diffused regions of the component (regions 3, 5, 4, 6, and 8 in this example), and not before. Indeed, if region 42 was formed before the diffused regions of the component, the various anneals of the trench, associated with the forming of the diffused regions, would damage porous silicon 42.

Specific embodiments have been described. Various alterations, modifications and improvements will readily occur to those skilled in the art.

In particular, embodiments have been described in the case where the power component is a triac. It should be understood that the like structure may apply to any other known type of vertical power component.

Further, in the described example, heavily-doped P-type wall 40 (FIG. 6A) is formed by diffusion of boron atoms. Any other adapted method may be used to form a vertical heavily-doped P-type wall. For example, a temperature gradient zone melting or TGZM may be used. Such a method especially has the advantage of being much faster than a method by diffusion of boron atoms.

Further, in the above-described examples, the component is formed from an N-type substrate. The provided embodiments also apply to the case where the initial substrate is a P-type substrate. In this case, the vertical walls delimiting the components (FIG. 6A) are heavily-doped N-type walls. In this case, it may be necessary, in the electrochemical etching resulting in forming ring-shaped region 42, to provide a lighting of the interface between the upper surface of wall 40 and the electrolytic solution, in order to enable the electrochemical reaction resulting in the forming of porous silicon.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A high-voltage vertical power component comprising a silicon substrate of a first conductivity type, and a first semiconductor layer of a second conductivity type extending into the silicon substrate from an upper surface of the silicon substrate, wherein a component periphery comprises:
   a porous silicon ring extending into the silicon substrate from said upper surface to a depth deeper than said first layer; and
   a doped ring of the second conductivity type, extending from a lower surface of the silicon substrate to said porous silicon ring and being vertically aligned and in contact with the porous silicon ring;
   wherein the component periphery has a width larger than or equal to 300 µm.

2. The component of claim 1, wherein said first layer extends laterally to the porous silicon ring.

3. The component of claim 1, wherein said porous silicon ring has a porosity ranging between 30 and 70 percent.

4. The component of claim 1, wherein said porous silicon ring is partially oxidized.

5. The component of claim 1, wherein said porous silicon ring extends in depth by between one third to two thirds of the thickness of the silicon substrate.

6. The component of claim 1, wherein:
   a first region of the first conductivity type extends in a portion of said first layer, said first region and a portion of said first layer being in contact with a first electrode; and
   a second semiconductor layer of the second conductivity type extends into the silicon substrate from the lower surface of the silicon substrate.

7. The component of claim 1, wherein:
   a first region of the first conductivity type extends in a portion of said first layer, said first region and a portion of said first layer being in contact with a first electrode;
   a second semiconductor layer of the second conductivity type extends into the silicon substrate from the lower surface of the silicon substrate; and
   a second region of the first conductivity type, extends in a portion of said second layer, substantially complementary to the first region in projection.

8. A vertical power device comprising:
   a substrate of a first conductivity type;
   a first semiconductor layer of a second conductivity type that extends into the substrate from an upper surface thereof;
   a second semiconductor layer of the second conductivity type that extends into the substrate from a lower surface thereof; and
   a component periphery comprising
      a porous silicon ring that extends into the substrate from the upper surface to a depth greater than the first semiconductor layer, and
      a doped ring of the second conductivity type that extends from the lower surface of the substrate to the porous silicon ring and being vertically aligned and in contact with the porous silicon ring;
   wherein the component periphery has a width larger than or equal to 300 µm.

9. A vertical power device as defined in claim 8, further comprising a first region of the first conductivity type in a portion of the first semiconductor layer and a first electrode in contact with the first region and the first semiconductor layer.

10. A vertical power device as defined in claim 9, further comprising a second region of the first conductivity type in the second semiconductor layer and a second electrode in contact with the second region and the second semiconductor layer.

11. A vertical power device as defined in claim 10, further comprising a gate region of the first conductivity type formed in the first semiconductor layer and a gate electrode in contact with the gate region.

12. A vertical power device as defined in claim 8, wherein the first semiconductor layer contacts the porous silicon ring.

13. A vertical power device as defined in claim 8, wherein the porous silicon ring has a porosity between 30 and 70 percent.

14. A vertical power device as defined in claim 8, wherein the porous silicon ring is partially oxidized.

15. A vertical power device as defined in claim 8, wherein the porous silicon ring extends into the substrate by one-third to two-thirds of a thickness of the silicon substrate.

16. A vertical power device as defined in claim 10, wherein the second region is offset laterally with respect to the first region.

\* \* \* \* \*